(12) United States Patent
Trelford et al.

(10) Patent No.: US 12,309,910 B2
(45) Date of Patent: May 20, 2025

(54) POINT OF LOAD MODULE AND HEATSINK THEREFOR

(71) Applicant: AcLeap Power Inc., Taipei (TW)

(72) Inventors: John Andrew Trelford, Richardson, TX (US); Alok K. Lohia, Dallas, TX (US); Arturo Silva, Allen, TX (US)

(73) Assignee: AcLeap Power Inc., Taipei (TW)

( * ) Notice: Subject to any disclaimer, the term of this patent is extended or adjusted under 35 U.S.C. 154(b) by 0 days.

(21) Appl. No.: 18/402,206

(22) Filed: Jan. 2, 2024

(65) Prior Publication Data

US 2024/0138051 A1 Apr. 25, 2024

Related U.S. Application Data

(63) Continuation of application No. 17/550,707, filed on Dec. 14, 2021, now Pat. No. 11,910,517.

(51) Int. Cl.
*H05K 1/02* (2006.01)
*H05K 1/14* (2006.01)
*H05K 1/18* (2006.01)
*H05K 7/20* (2006.01)

(52) U.S. Cl.
CPC .......... *H05K 1/0203* (2013.01); *H05K 1/141* (2013.01); *H05K 1/181* (2013.01); *H05K 7/2039* (2013.01); *H05K 2201/1003* (2013.01)

(58) Field of Classification Search
CPC ...... H05K 1/0203; H05K 1/181; H05K 7/209; H05K 2201/066; H05K 1/141; H05K 1/0204; H05K 2201/1003; H05K 1/165; H05K 7/2039; H05K 7/20445; H05K 7/1427; H05K 1/021; H05K 1/0215; H05K 1/114; H05K 2201/09309; H02M 3/003; H02M 1/008; G06F 1/26; G06F 1/20; G06F 1/189; G06F 1/206; G06F 1/263; H02J 13/00007
See application file for complete search history.

(56) References Cited

U.S. PATENT DOCUMENTS

| | | | |
|---|---|---|---|
| 5,311,395 | A | 5/1994 | McGaha |
| 6,346,672 | B1 | 2/2002 | Horng |
| 7,286,361 | B2 | 10/2007 | Yamanaka |
| 7,742,310 | B2 | 6/2010 | Neumann |
| 2004/0037044 | A1 | 2/2004 | Cook |
| 2004/0212964 | A1 | 10/2004 | Belady |
| 2004/0246681 | A1 | 12/2004 | Belady |

(Continued)

*Primary Examiner* — Michael A Matey
(74) *Attorney, Agent, or Firm* — McCarter & English, LLP; Michael M. Gnibus

(57) ABSTRACT

A system includes a point of load (POL) module. The POL module includes a point of load printed circuit board. At least one inductor is mounted to the point of load printed circuit board. The POL module includes a power network. The POL module is configured to be surface mounted. The system further includes a heat sink including a first leg configured to be surface mounted adjacent the point of load printed circuit board, a second leg configured to be surface mounted adjacent the point of load printed circuit board opposite the first leg, and a cap portion connecting the first leg to the second leg. The heat sink is sized and shaped to encompass the POL module and configured to connect to the power network. The power network may be a PGND network.

20 Claims, 11 Drawing Sheets

(56) References Cited

U.S. PATENT DOCUMENTS

| | | | |
|---|---|---|---|
| 2005/0012192 A1* | 1/2005 | Saso | H05K 1/141 |
| | | | 257/E23.114 |
| 2005/0152117 A1 | 7/2005 | Belady | |
| 2006/0082945 A1 | 4/2006 | Walz | |
| 2006/0285297 A1 | 12/2006 | Conner | |
| 2007/0097653 A1* | 5/2007 | Gilliland | H01L 23/552 |
| | | | 257/E23.114 |
| 2009/0086437 A1 | 4/2009 | Tsuyuno | |
| 2010/0302729 A1 | 12/2010 | Tegart | |
| 2011/0155360 A1 | 6/2011 | Liu | |
| 2012/0281360 A1* | 11/2012 | Nicol | G16H 20/13 |
| | | | 29/825 |
| 2013/0242496 A1 | 9/2013 | Ahmad | |
| 2015/0201533 A1* | 7/2015 | Daughtry, Jr. | H05K 9/0032 |
| | | | 29/840 |
| 2019/0109538 A1 | 4/2019 | Zhou | |
| 2022/0007502 A1 | 1/2022 | Chiang | |

\* cited by examiner

POINT OF LOAD MODULE AND HEATSINK THEREFOR

CROSS-REFERENCE TO RELATED APPLICATION

This application is a continuation of U.S. patent application Ser. No. 17/550,707, filed Dec. 14, 2021 and titled "POINT OF LOAD MODULE AND HEATSINK THEREFOR", which is hereby incorporated by reference in its entirety

BACKGROUND

The present invention relates to board mounted point of load (POL) power converter modules and mechanisms to address thermal management of POL modules.

Point of load modules are used to meet power supply requirements for numerous categories of applications. Without limitation, POL modules are used in connection with distributed power architectures, data and enterprise networks, telecommunications equipment, a broad range of embedded applications, industrial, process and test equipment, microprocessor powered applications, LANs/WANs, workstations, servers and data storage and others, as is well known. Challenges related to current POL devices include thermal management, which is an especially acute problem in current electronic systems where space is at a premium.

Cooling of point of load modules presently relies on the conduction of heat generated by components of the module. At least some of the heat generated by the components enters a printed circuit board (PCB) portion of the module. Heat is transmitted from the point of load PCB via conduction to a main printed circuit board on which the POL module is mounted. In addition to conduction, POL components, such as inductors, FETs, capacitors, and so on, are cooled via heat convection.

Devices according to the disclosure improve POL module cooling without increasing the footprint area of the module itself. This is advantageous since some POL applications may not need additional cooling beyond what presently occurs and therefore can be used without modification.

There is a need to improve the dissipation of heat generated by a point of load module without adding additional footprint area to the module itself while maintaining the option of using the same high power density POL module and associated elements as presently constructed. Devices according to the present disclosure satisfy the need.

BRIEF SUMMARY

In one aspect, the disclosure includes a system with a point of load converter module (POL). The POL module includes a point of load printed circuit board. At least one inductor is mounted to the point of load printed circuit board. The POL module includes a power network, which may be a PGND network. The point of load converter module is configured to be surface mounted. The system includes a heat sink including a first leg configured to be surface mounted adjacent the point of load printed circuit board, a second leg configured to be surface mounted adjacent the point of load printed circuit board opposite the first leg, and a cap portion connecting the first leg to the second leg. The heat sink is sized and shaped to encompass the POL and is configured to connect to one or a PGND network, a Vin network, and a Vout network of the POL.

Another aspect of the disclosure includes system with a main circuit board. The main circuit board includes a plurality of conductive pads. The system includes a point of load converter module (POL) including a point of load printed circuit board surface mounted to the main circuit board. At least one inductor is mounted to the point of load printed circuit board. A power network is in communication with the main circuit board. A heat sink includes a first leg surface mounted to the main circuit board adjacent the point of load printed circuit board, a second leg surface mounted to the main circuit board adjacent to the point of load printed circuit board opposite the first leg, and a cap portion connecting the first leg to the second leg. The heat sink is sized and shaped to encompass the POL and the heat sink is connected to the PGND network.

These and other features will be apparent from the following detailed description and accompanying drawings.

DETAILED DESCRIPTION

Figure 1:
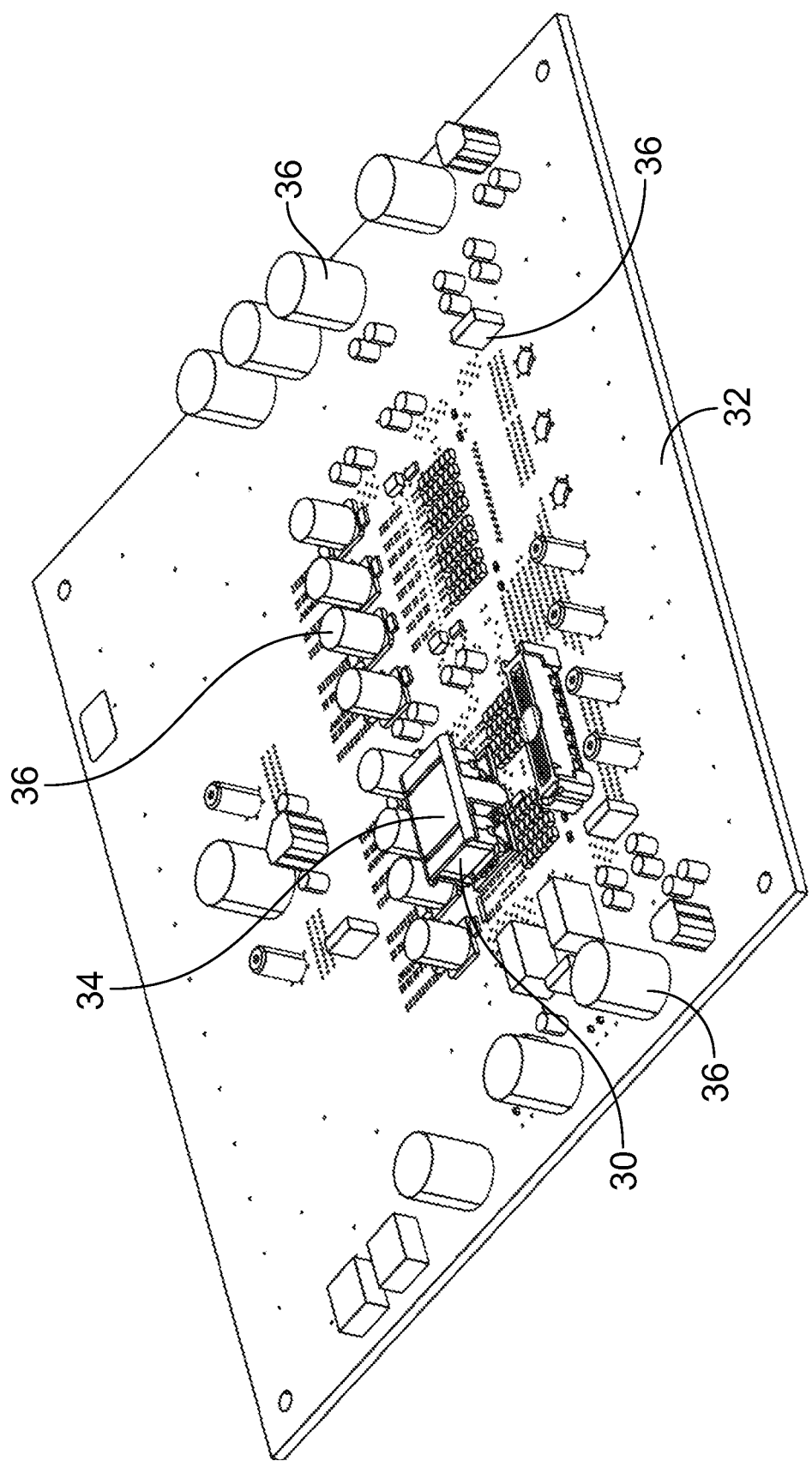
FIG. 1 is a main printed circuit board with electronic components, a point of load module with two inductors mounted to the main board, and a surface mount heat sink configured to dissipate heat generated by the POL module mounted to the main board according to the disclosure.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings. For purposes of description herein, the terms "upper", "lower", "left", "rear", "right", "front", "vertical", "horizontal", and derivatives thereof shall relate to the invention as oriented in the figures. Use of the term "configured" is intended to refer to the shape and size of a structural element.

Where possible, any terms expressed in the singular form herein are meant to also include the plural form and vice versa, unless explicitly stated otherwise. Also, as used herein, the term "a" and/or "an" shall mean "one or more" even though the phrase "one or more" is also used herein. Furthermore, when it is said herein that something is "based on" something else, it may be based on one or more other things as well. In other words, unless expressly indicated otherwise, as used herein "based on" means "based at least in part on" or "based at least partially on".

The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. All methods described herein can be performed in any suitable order unless otherwise indicated herein or otherwise clearly contradicted by context. The use of any and all examples, or exemplary language (e.g., "such as") provided herein, is intended merely to better illuminate the invention, and does not pose a limitation on the scope of the invention unless otherwise claimed. No language in the specification should be construed as indicating any non-claimed element as essential to the practice of the invention.

Now referring to the figures, there is illustrated in FIGS. 1-7 an exemplary point of load (POL) module 30, also known as a point of load converter, which is installed on a main printed circuit board 32 with a heat sink 34 operatively associated with the POL module. The POL module 30 is installed on the main printed circuit board 32 using well-known surface mount construction and techniques. A heat sink 34 may be surface mounted to the main printed circuit board 32 adjacent to and generally over, surrounding, or encompassing the POL module 30 using the same techniques for installing other components on the main printed circuit board. It will be understood that encompassing does not mean entirely enclosing, but rather, housing in such a manner so as to permit sufficient airflow through the heat sink 34 and over the components of the POL module 30 and thus enabling convective cooling thereof.

Figure 2:
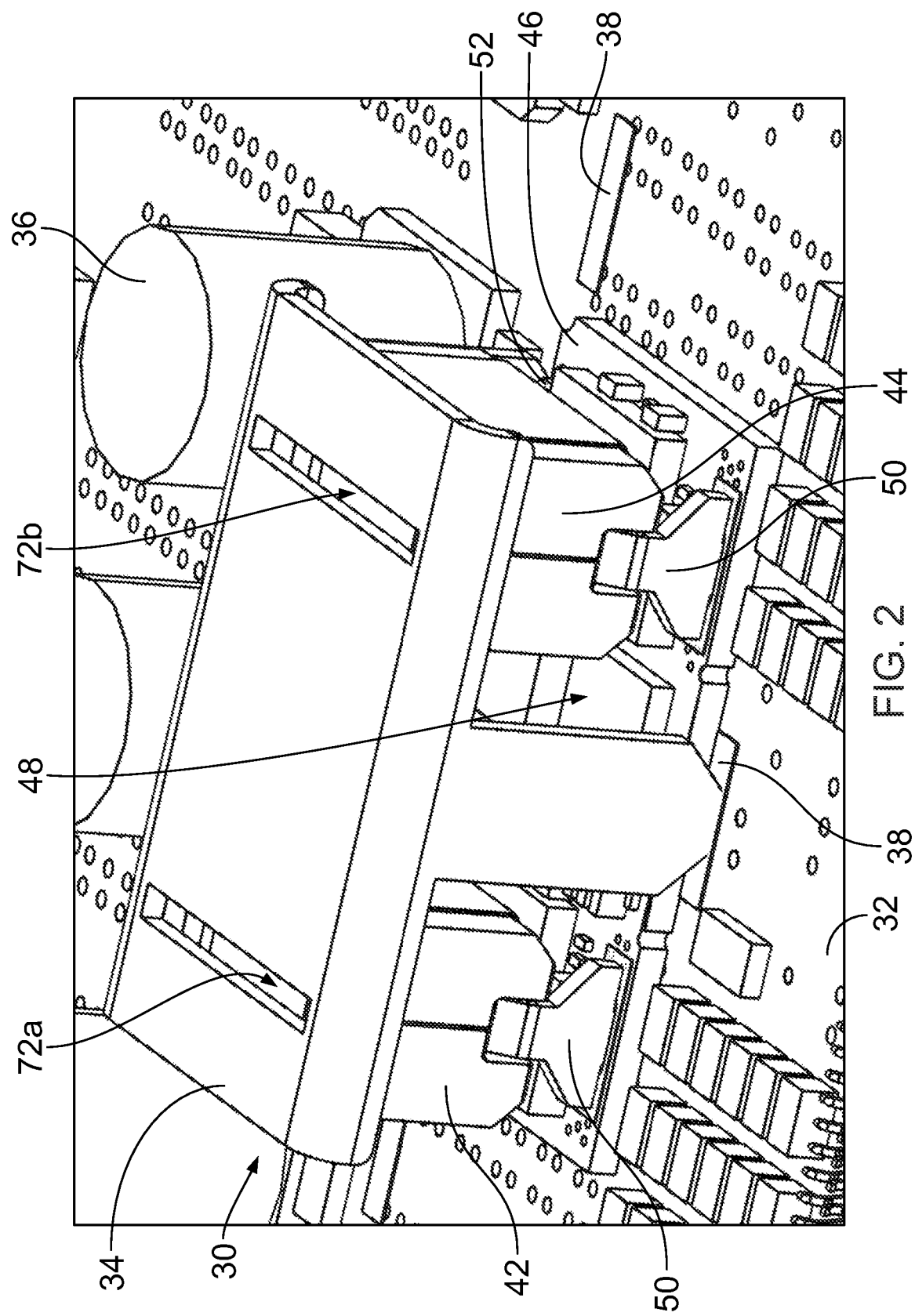
FIG. 2 is a close up view of the point of load module and heat sink of FIG. 1 and a portion of the main printed circuit board.

The main printed circuit board 32 may be a single sided or a double sided assembly and is of standard construction for installing electronic components 36 and electronic modules using surface mount technology and optionally also other techniques. The main printed circuit board 32 includes a set of electronic components (some examples generally indicated at 36) for producing desired electrical and electronic function(s) of the main printed circuit board. The types and layout of the electronic components 36 as shown is not to be considered limiting. The main printed circuit board 32 is configured, as is known, to place the electronic components 36 and the POL module 30 into electrical communication. As shown in FIG. 2, the main printed circuit board 32 includes conductive pads, examples of which are shown at 38. The conductive pads 38 may be made of materials that are electrically and also thermally conductive, such as copper, as is known.

The POL module 30, in this example, is a single module, which is packaged for deployment as a single self-contained unit and configured as a leadless module having electrical terminations 40 (see FIG. 5) for surface mount soldering to respective conductive pads 38 of the main printed circuit board 32. As will be explained in detail referring to FIG. 5, some of the electrical terminations 40 form a power ground network, often referred to as "PGND". The point of load module 30 also includes a "voltage in" (Vin) network and a "voltage out" (Vout) network. A PGND network is a common ground between the Vin and the Vout networks.

In operation, a significant amount of heat generated by the POL module 30 is conducted into the pads 38, into the main printed circuit board 32, and from the main circuit board into a heat sink 34 mounted on the main printed circuit board.

Such POL modules 30 can be configured to satisfy different power output requirements by altering the number and types of components and associated circuitry to provide the desired power output. For example, in the illustrated example of FIG. 2, the POL module 30 includes a first inductor 42 positioned at an end of the POL printed circuit board 46 opposite a second inductor 44 on the POL printed circuit board. It will be understood that the POL module 30 includes associated electrical components 48 installed on the POL printed circuit board 46 as is known to generate and regulate the desired functions of the POL module. The heat sink 34 is surface mounted to pads 38 of the main printed circuit board 32 in a position adjacent to the POL module 30 as will be explained in more detail herein so as to conduct heat from the main printed circuit board 32 into the heat sink 34 and then into the surrounding atmosphere by convection.

Figure 3:
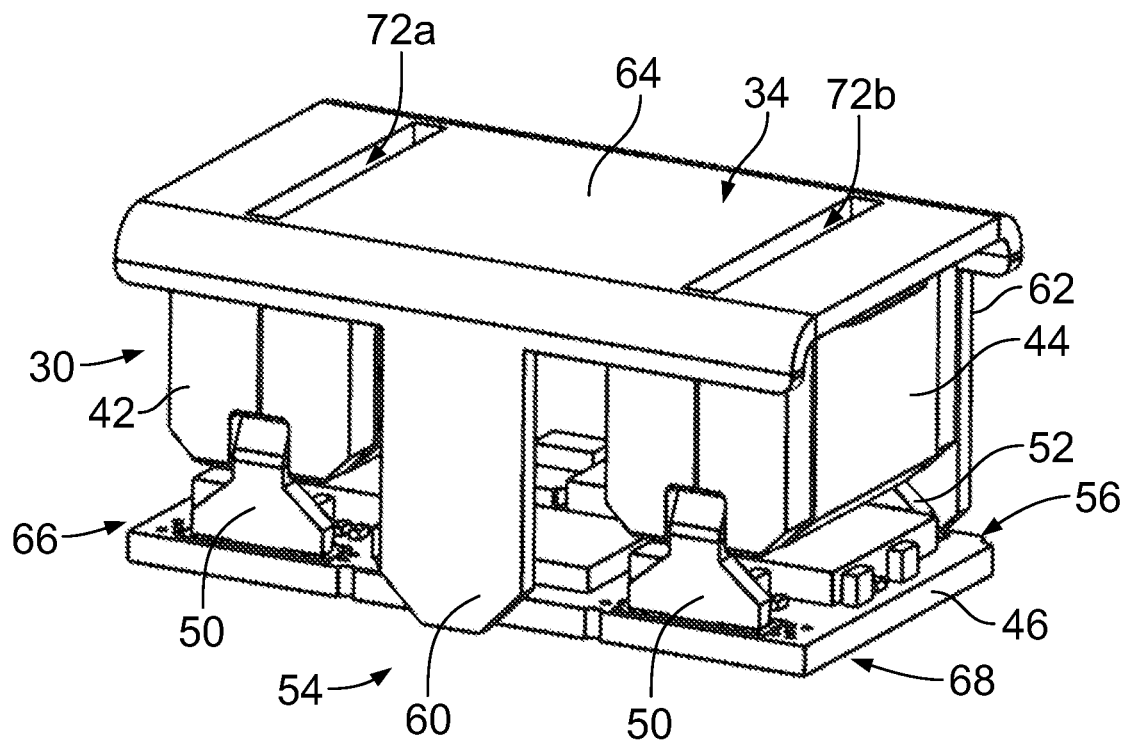
FIG. 3 is a top perspective first side view of the point of load module and the heat sink of FIG. 1.
Figure 4:
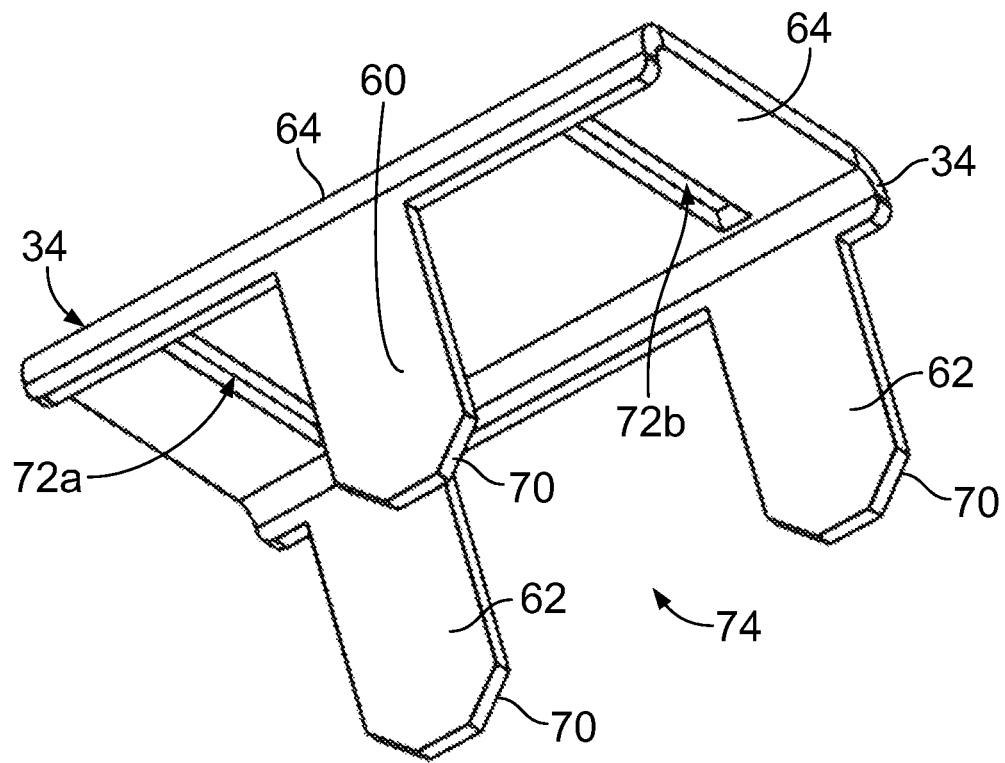
FIG. 4 is a bottom perspective view of a heat sink of FIG. 1.

FIG. 3 shows an example of a POL module 30 and heat sink 34. The POL module 30 includes a POL printed circuit board 46 upon which electrical components 48 are mounted, by known surface mount techniques. The electrical components 48 (FIG. 6) include a standard set of electrical and electronic components and circuits for producing the desired output of the module. The electrical components 48, in this example, include a dual inductor configuration with a first inductor 42 and a second inductor 44. The first inductor 42 and the second inductor 44 are each attached to and placed into communication with the POL printed circuit board 46 by a pair of inductor pins 50, 52 (see also FIG. 6). Inductor pins 50 of each first and second inductor 42, 44 are disposed adjacent a first side 54 of the POL printed circuit board 46. Inductor pins 52 of each first and second inductor 42, 44 are disposed adjacent a second side 56 of the POL printed circuit board 46.

Figure 11:
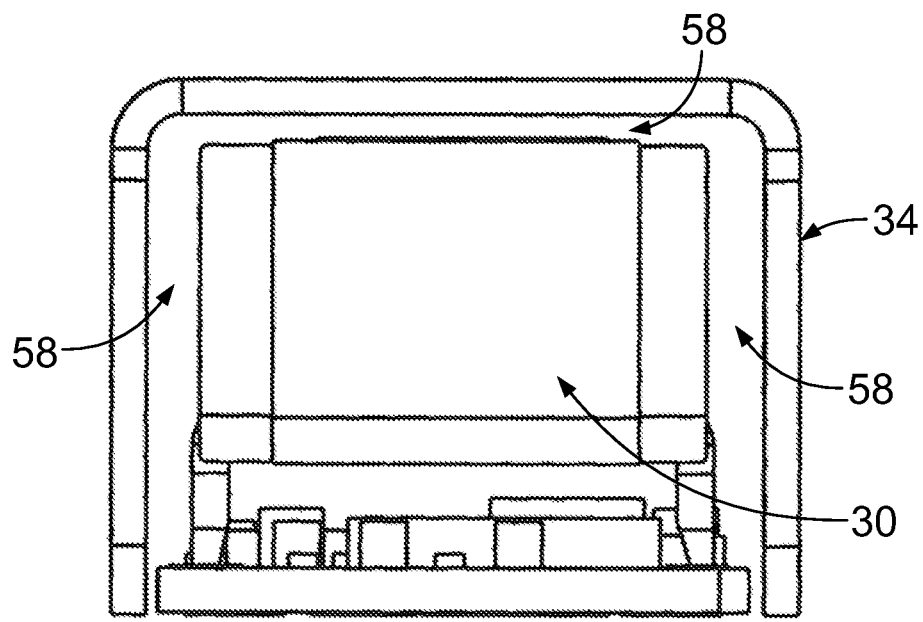
FIG. 11 is an end view of a point of load module and heat sink according to aspects of the disclosure.

The heat sink 34 is sized and shaped to fit over and around the POL module 30 and leave a space 58 therebetween for air circulation (see FIG. 11, for example). The space 58 may measure a distance approximately the same as the thickness of the heat sink 34. The heat sink 34 is attached, via surface mount techniques, to pads 38, on the main printed circuit board 32 (see FIG. 2) and is made of any suitable thermally conductive, heat sink material including aluminum or copper. The heat sink 34 may be manufactured by extruding, forging, machining, stamping, casting, or any suitable method.

The heat sink 34 may include a first side leg 60 and two second side legs 62. The heat sink 34 may also include only one second side leg, which may be configured to mount the heat sink to the main printed circuit board 32 in a stable fashion.

The first side leg 60 is attached to a pad 38 of the main printed circuit board 32 adjacent the first side 54 of the POL module 30. The second side legs 62 are attached to a pad 38 of the main printed circuit board 32 adjacent the second side 56 of the POL module 30. The heat sink 34 further includes a cap portion 64 that extends between and interconnects the first leg 60 and the second legs 62. Both first and second legs 60, 62 may be flat, rectangular plates or posts with a length sufficient to hold the cap portion 64 over the POL module 30. In embodiments, there is space between the POL module 30 and the cap portion. The distal ends 70 (FIG. 4) of the legs 60, 62 may be tapered or beveled to a size permitting securement to the conducting pads 38 (FIG. 2).

The cap portion 64 may be generally rectangular, flat, and sized approximately the same area as that of the POL printed circuit board 46. The cap portion 64 may also have fins or other features (not shown) as is known for adding surface area. The cap portion 64 may include two slits 72a, 72b. The first slit 72a may be a rectangular opening or slot formed through the cap portion 64 and centered over the first inductor 42. The second slit 72b may be a rectangular opening or slot formed through the cap portion 64 and centered over the second inductor 44. The lengths of the slits 72a, 72b may be approximately the same as the depth, front to back, of the first and second inductors 42, 44. The slits 72a, 72b are provided to reduce magnetic fringing of flux generated by the inductors.

The first leg 60 connects to the cap portion 64 about halfway between a first end 66 and a second end 68 of the heat sink 34. The second legs 62 connect to the cap portion 64 in a spaced apart configuration where each of the second legs are positioned respectively adjacent the first end 66 and the second end 68 and generally adjacent the inductor pins 52 of respective first inductor 42 and second inductor 44. There is a gap or space 74 (FIG. 4) between the second legs 62 to permit air circulation through the POL module 30. The positions of the second legs 62, being aligned with the first and second inductors 42, 44, permit a maximum amount of air circulation of the electrical components 48. It will be understood that the heat sink 34 is configured to be optimized for the configuration of the module with which it is used at least in terms of size and shape.

Figure 5:
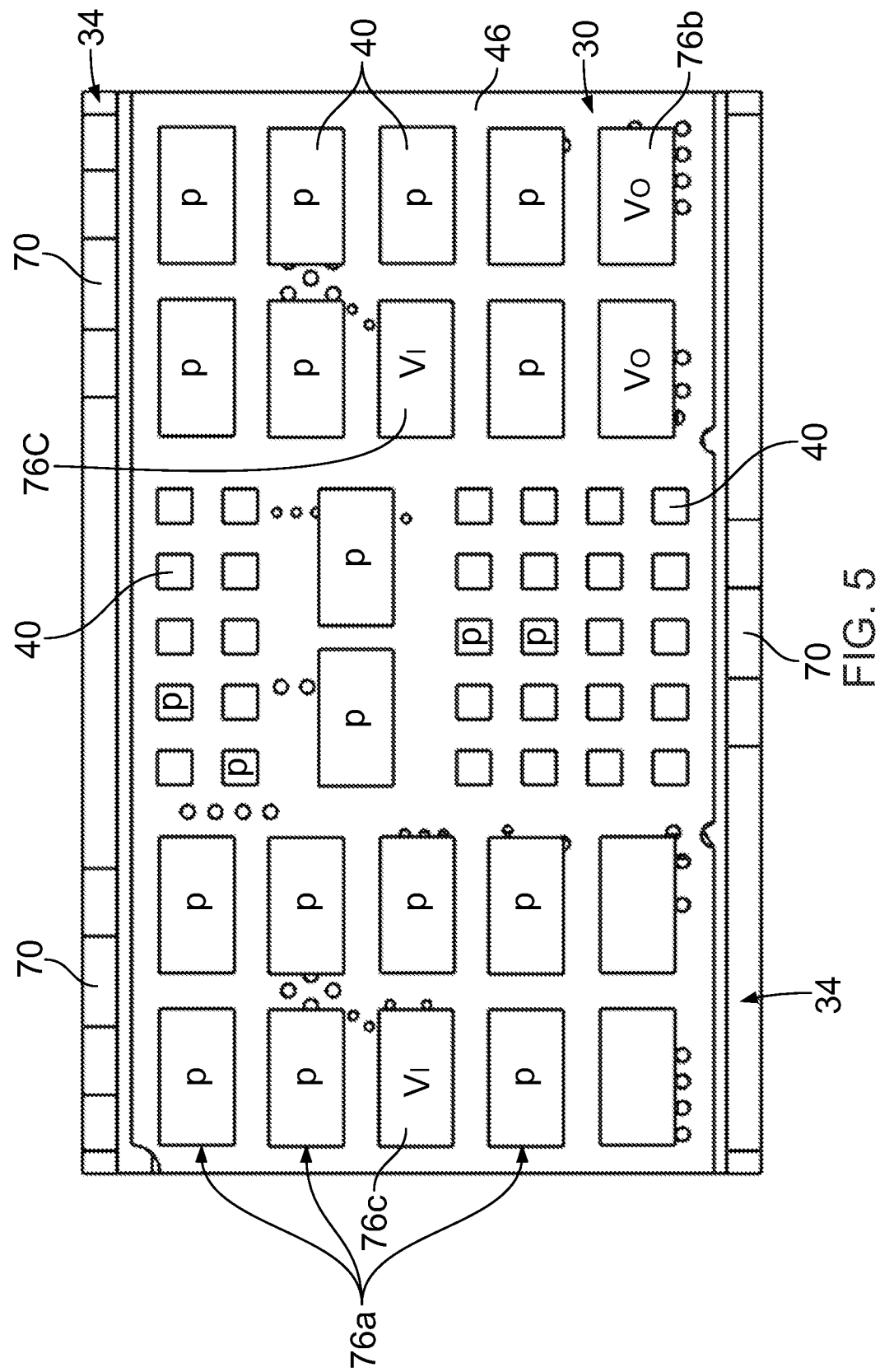
FIG. 5 is bottom view of the point of load module and heat sink of FIG. 1.
Figure 6:
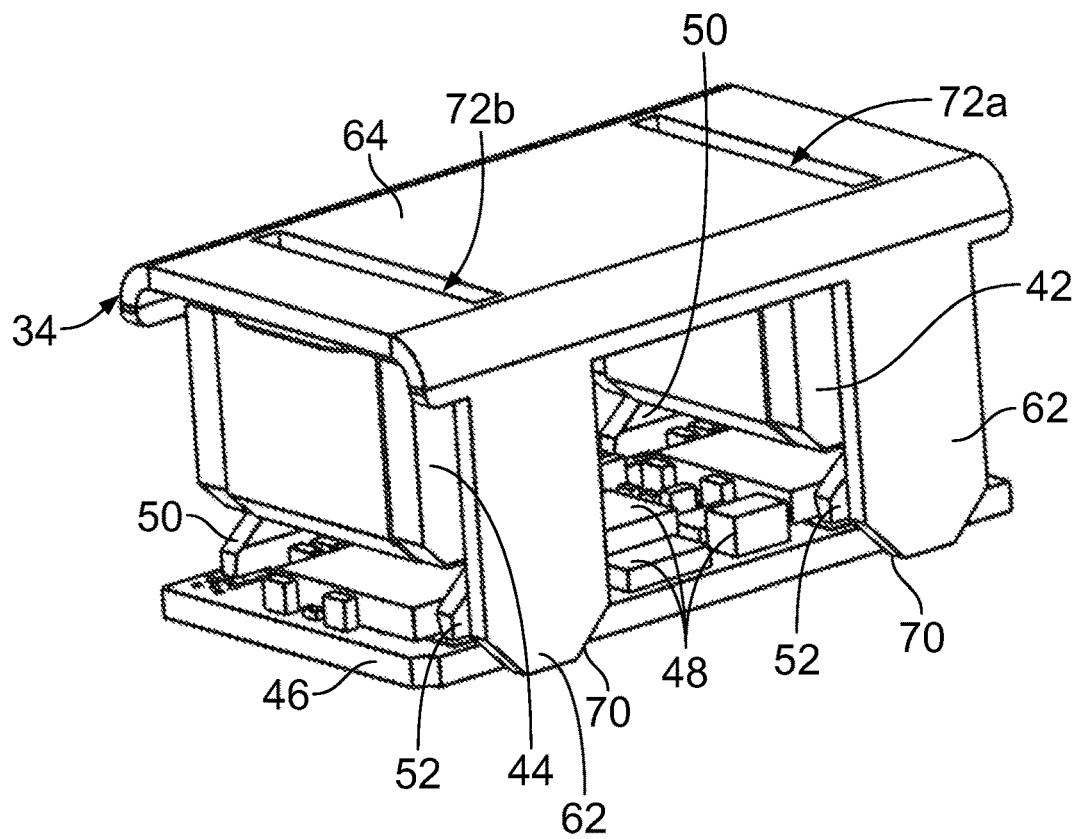
FIG. 6 is a top perspective second side view of the point of load module and heat sink of FIG. 1.
Figure 7:
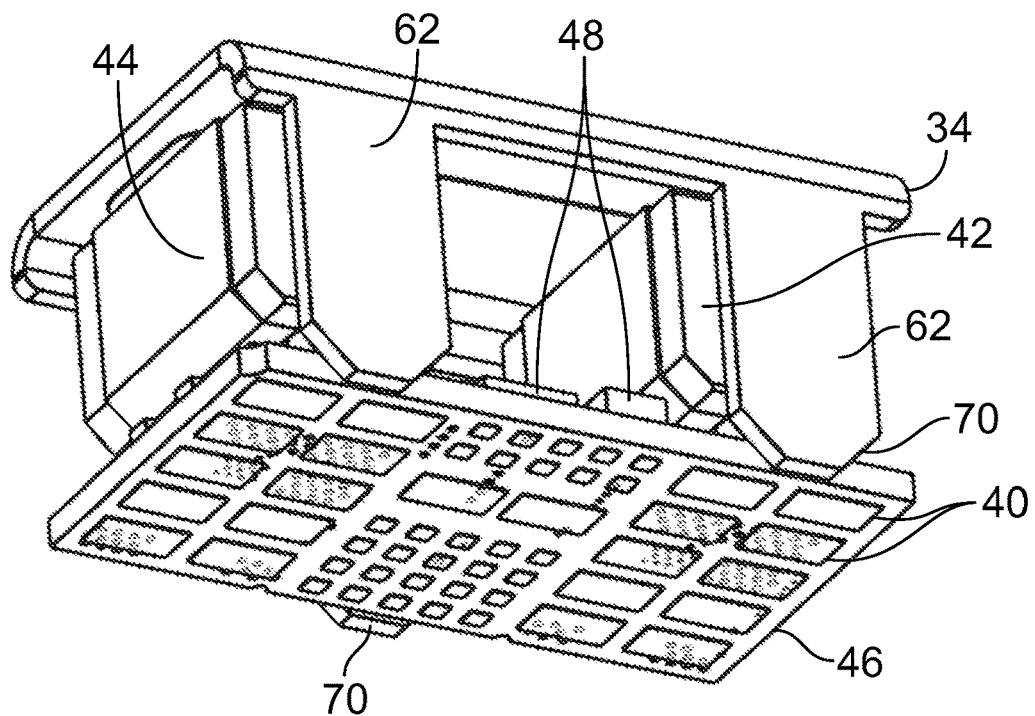
FIG. 7 is a bottom perspective view of the point of load module and heat sink of FIG. 1.
Figure 8:
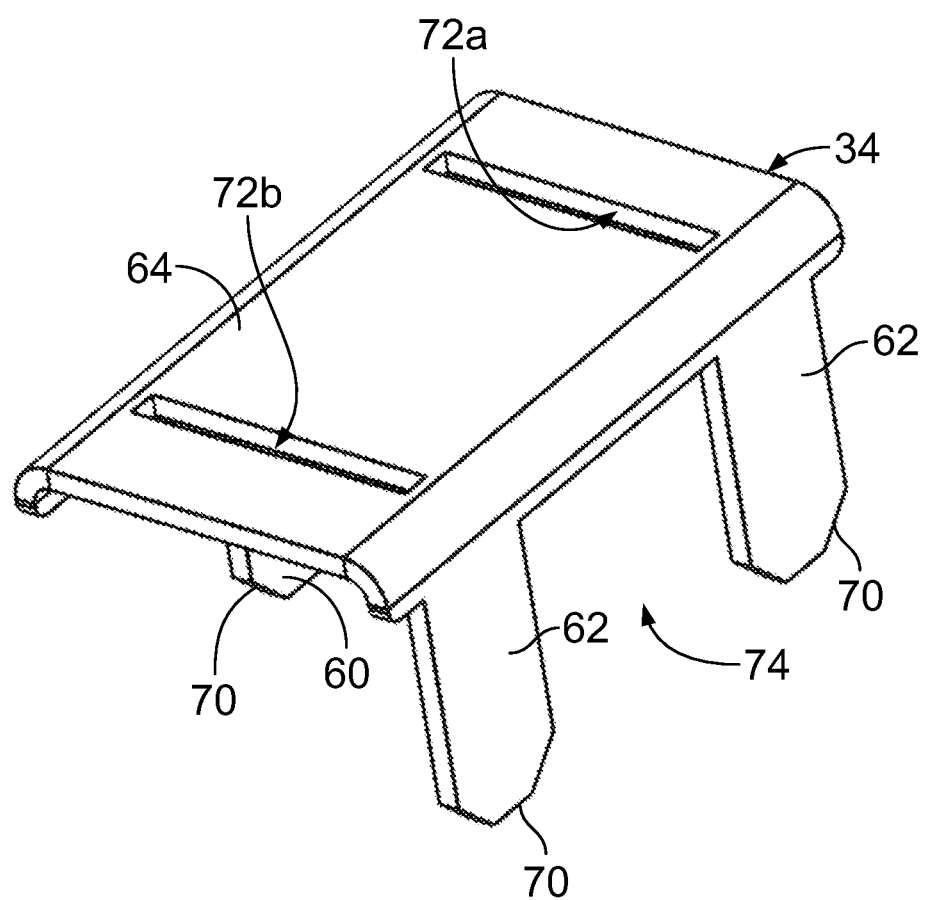
FIG. 8 is a top perspective second side view of the heat sink of FIG. 1.

Turning to FIG. 5, electrical terminations 40 on the POL printed circuit board 46 that form all or part of an example of a PGND network 76a are indicated with "P". To maximize the efficient dissipation of heat generated by the POL module 30, the distal ends 70 of the legs 60, 62 are positioned adjacent the POL printed circuit board 46 and as close as possible to electrical terminations 40 that form part of the PGND network 76a. For example, the first leg 60 is attached to the main printed circuit board 32 adjacent the first side 54 and the second legs 62 are attached to the main board adjacent the second side 56. In embodiments, the legs 60, 62 are each thermally connected to the PGND network 76a, for example, during the reflow and soldering process used to attach the POL module 30 and the heat sink 34 to the main printed circuit board 32 (FIG. 1). In alternative embodiments, the legs 60, 62 may be connected to a "voltage in" (Vin or Vi) network, some elements of which being indicated as 76c or a "voltage out" network (Vout or Vo) some elements of which being indicated as 76b in the figure. For purposes of the disclosure, the PGND, Vin, and Vout circuits or networks will be referred to as a power network.

Figure 9:
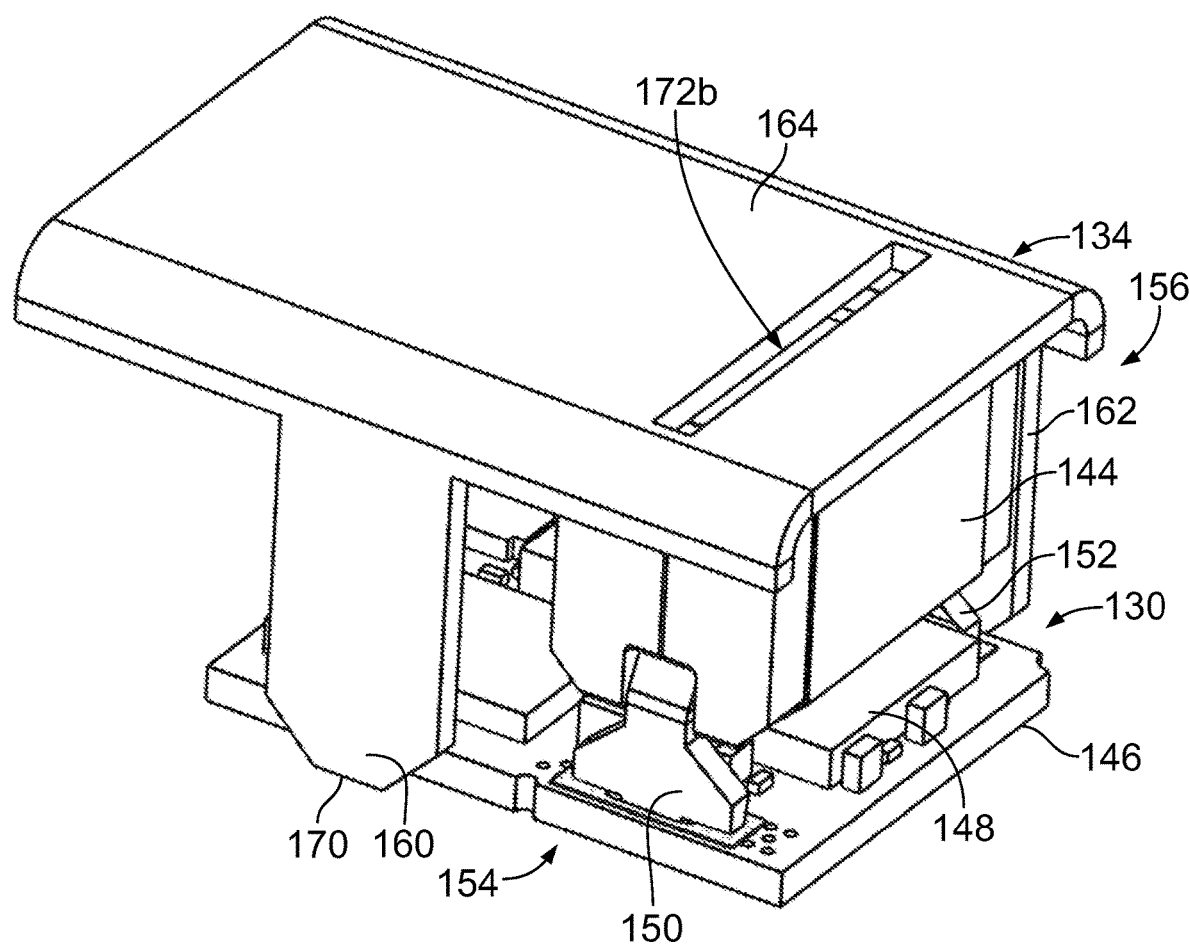
FIG. 9 is a top perspective first side view of a point of load module with a single inductor and heat sink according to the disclosure.
Figure 10:
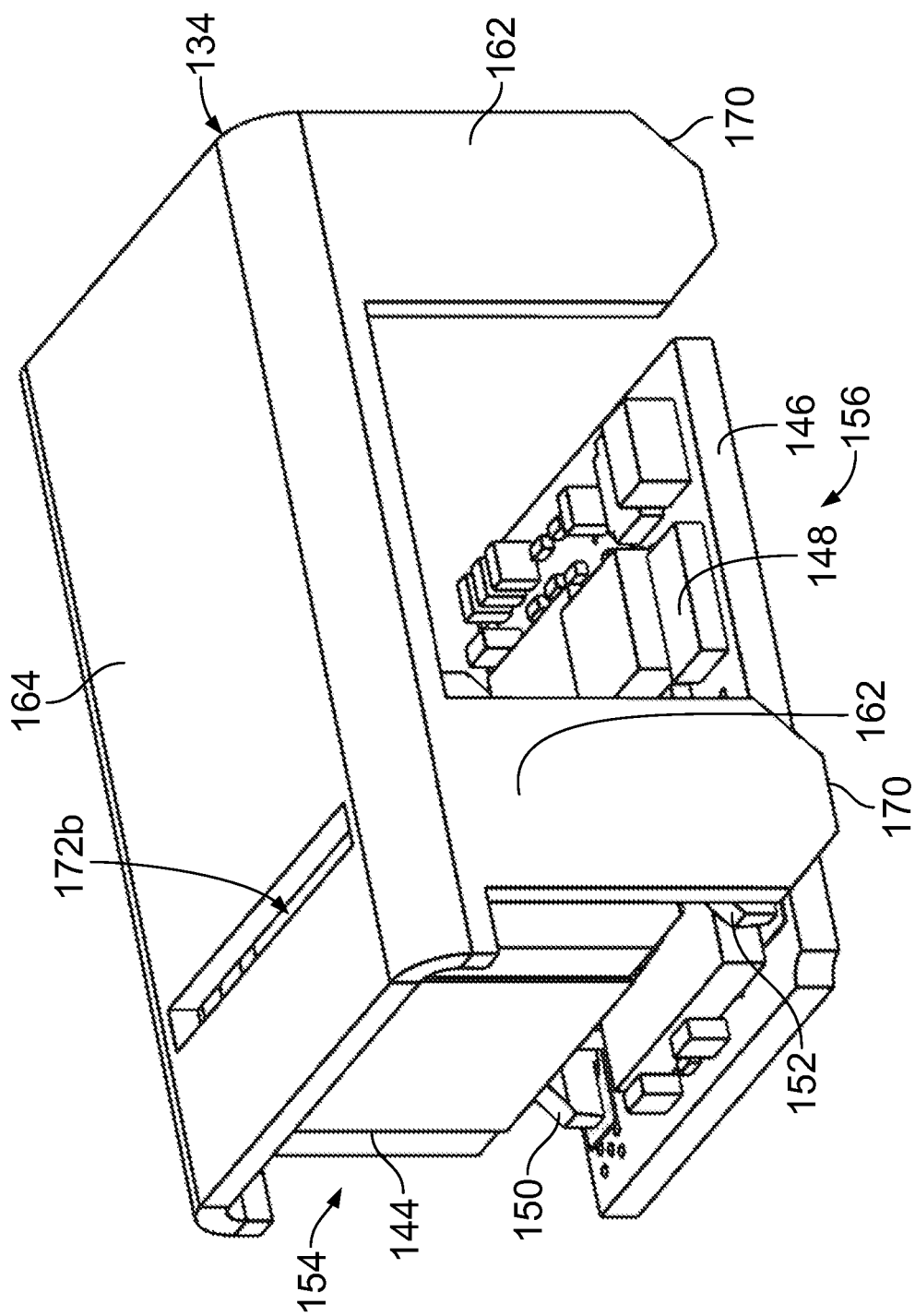
FIG. 10 is a top perspective second side view of the point of load module and heat sink of FIG. 9.

FIGS. 9 and 10 illustrate a POL module 130 with an alternative configuration compared to the POL module of FIGS. 1-8. In particular, the POL module 130 of FIGS. 9 and 10 has one inductor 144. In this example, the POL module 130 may be used in conjunction with the same heat sink 34 detailed in the example of FIGS. 1-8. However, the POL module 130 may be used with a heat sink 134 which is modified from the above-detailed example.

The POL module 130 includes a POL printed circuit board 146, upon which is mounted components 148, including an inductor 144. The inductor 144 is attached to the POL printed circuit board 146 via an inductor pin 150 on a first side 154 of the POL printed circuit board and via an inductor pin 152 on the second side 156 of the POL printed circuit board. The POL printed circuit board 146 is attached to a suitable main printed circuit board in the same manner as detailed above.

Heat sink 134 is constructed and installed similarly to that previously detailed in connection with the example of FIGS. 1-8 and accordingly similar aspects of the POL module shown in the present example of FIGS. 9 and 10 will not be discussed in detail here. The size and shape of the heat sink 134 is the same as detailed above and is therefore larger than the POL printed circuit board 146, which is sized and shaped to carry components 148 and a single inductor 144. In other embodiments, the heat sink 134 may be about the same size in area as that of the module with which it is being used. The heat sink 134 has a first leg 160 which is to be positioned adjacent the first side 154 and a pair of spaced legs 162 which is to be positioned adjacent the second side 156. One of the legs 162 may be positioned adjacent the inductor pin 152 of the inductor 144 so as to not block airflow over the POL module 130. The heat sink 134 has a cap portion 164 with a single slot 172b, which is positioned over the inductor 144 to reduce magnetic fringing. The heat sink 134 may have two slots as shown in the previous version. The legs 160, 162 all have a distal end 170 configured to be attached, as above, to a main circuit board and, in particular, may be soldered so as to be connected to a PGND network (like that shown in FIG. 5 adapted for the number and types of components in the POL module).

Figure 12:
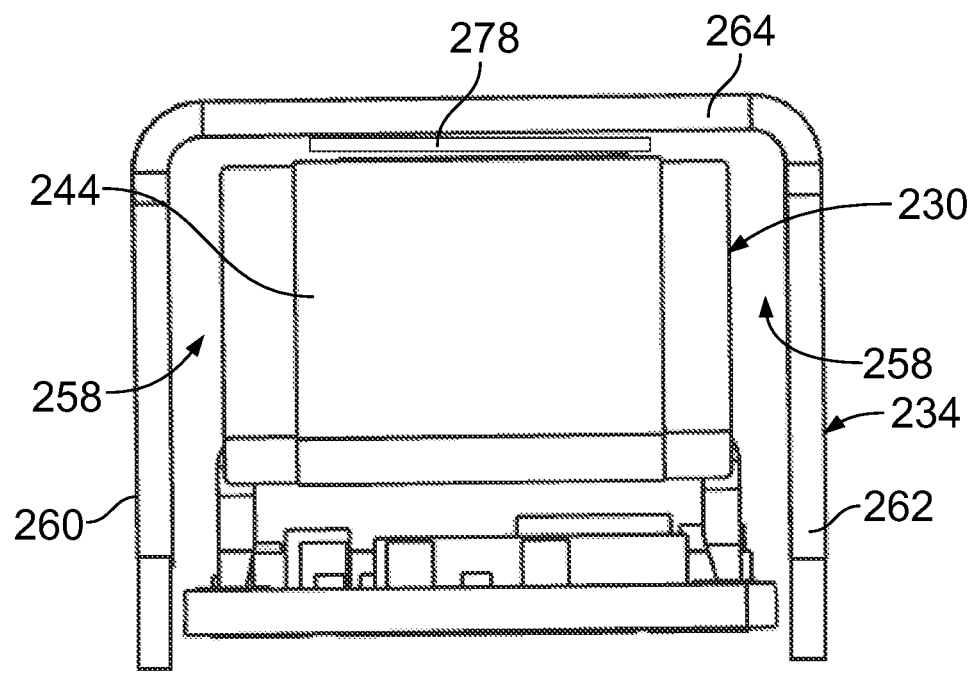
FIG. 12 is an end view of a point of load module and heat sink according to alternative aspects of the disclosure.

FIG. 11 illustrates a heat sink 34 that is configured to leave space 58 or air gap surrounding the POL module 30. FIG. 12 illustrates a heat sink 234 that is configured to leave a space 258 or air gap adjacent the legs 260, 262 of the POL module 230. However, the space between the cap portion 264 of the heat sink 234 and the inductor 244 is provided with a thermal conductive element or material 278. The thermal conductive element or material 278 may be thermal conductive paste or any suitable heat transfer material or element. In some embodiments the legs 260, 262 are inserted into a slot (not shown) formed in the main circuit board (not shown) in order to permit the heat sink 234 to assume a sufficiently closer position relative to the POL module 230 and permit contact with the conductive material 278.

Figure 13:
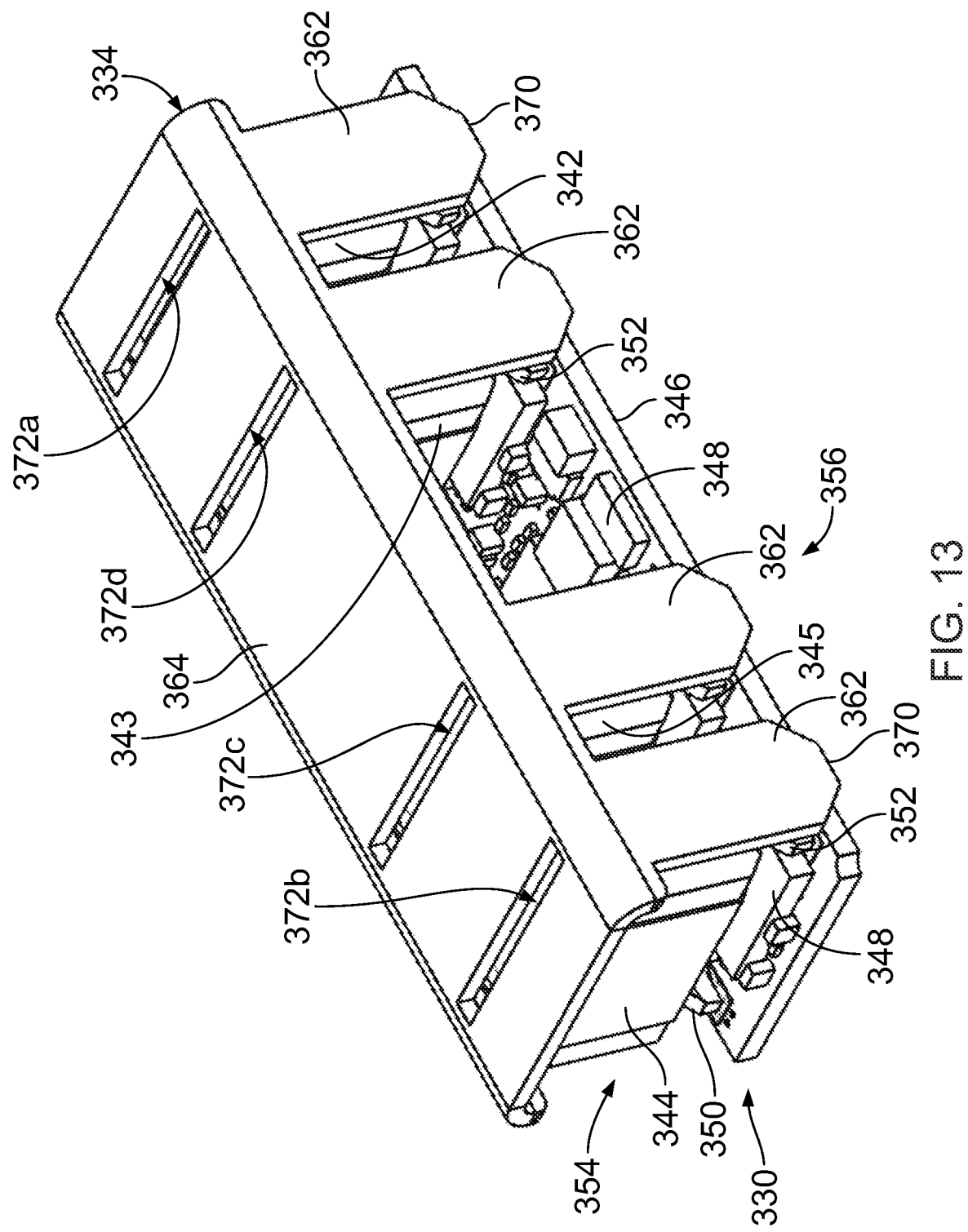
FIG. 13 is a top perspective first side view of a point of load module with four inductors and a heat sink according to the disclosure.

FIG. 13 illustrates a POL module 330 with an alternative configuration compared to the POL module of FIGS. 1-10. In particular, the POL module 330 of FIG. 13 has four inductors 342, 343, 344, and 345. In this example, the POL module 330 uses a heat sink 334 configured to accommodate the size and shape of the POL module 330 and inductors 342-345. However, the heat sink 334 is attached to a suitable main board in a like manner as those described above and, in particular, to a PGND network (like that shown in FIG. 5 adapted for the number and types of components in the POL module).

The POL module 330 includes a POL printed circuit board 346, upon which is mounted components 348, including inductors 342-345. The inductors 342-345 are attached to the POL printed circuit board 346 via inductor pins 350 on a first side 354 of the POL printed circuit board and via inductor pins 352 on the second side 356 of the POL printed circuit board. The POL printed circuit board 346 is attached to a suitable main printed circuit board in the same manner as detailed above.

Heat sink 334 is constructed and installed similarly to that previously detailed in connection with the example of FIGS. 1-8 and accordingly similar aspects of the POL module shown in the present example of FIG. 13 will not be discussed in detail here. The size and shape of the heat sink 334 is generally the same as the POL module 330, which is sized and shaped to carry components 348 and inductors 342-345. The heat sink 334 has a first leg (not shown) which is positioned adjacent the first side 354 and four spaced legs 362 positioned adjacent the second side 356. Each of the legs 362 are positioned adjacent (i.e., aligned with) a respective one of the inductor pin 352 of the inductors 342-345 so as to not block airflow over the POL module 330. The heat sink 334 has a cap portion 364 with four slots 372a-d, each of which is positioned over a respective one of the inductors 342-345 to reduce magnetic fringing. The legs 362 each have a distal end 370 configured to be attached, as above, to a main circuit board and, in particular, may be soldered so as to be connected to a PGND network (like that shown in FIG. 5 adapted for the number of types of components).

Figure 14:
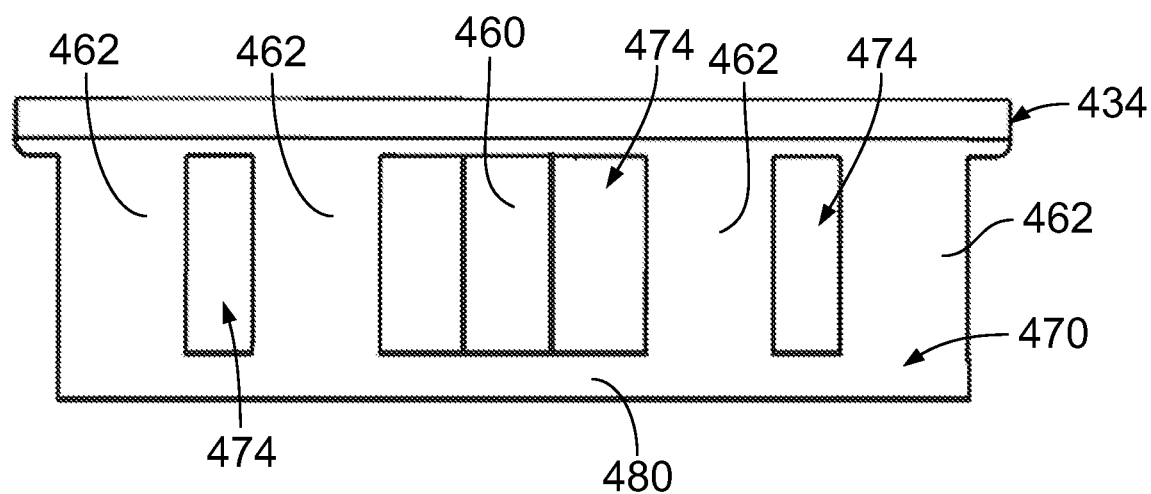
FIG. 14 is a second side view of an alternative heat sink configured to be employed with the point of load module of FIG. 13.

FIG. 14 is a heat sink 434 that is a modified version of the heat sink of FIG. 13. Specifically, the distal ends 470 of the legs 462 are formed into a unitary base 480 to increase conduction surface area from main board while maintaining spaces 474 between the legs for promoting air circulation and cooling. The entire base 480 is attached to a suitably shaped and sized conducting pad (not shown) on a suitably configured main board (not shown). The heat sink 434 also has a single leg 460, constructed as in the previous heat sink examples on a side opposite the legs 462. The heat sink 434 may be used in the application employing the POL module 330 of FIG. 13 in place of the heat sink 334.

The invention claimed is:

1. A system, comprising:
   a module, comprising:
      a first printed circuit board (PCB) electrically defining a power network, wherein the first PCB has a first side and a second side opposing the first side, and wherein the second side is configured to be surface mounted to a second PCB to electrically connect the power network to first and second electrically conductive pads on the second PCB; and
      at least one electrical component mounted to the first side of the first PCB; and
   a heat sink, comprising:
      a first leg configured to be surface mounted to the first electrically conductive pad on the second PCB adjacent to the first PCB;
      at least one second leg opposite the first leg and configured to be surface mounted to the second electrically conductive pad on the second PCB adjacent to the first PCB; and
      a cap portion connecting the first leg to the at least one second leg,
      wherein the heat sink is sized and shaped to at least partially encompass the module, and
      wherein the heat sink is configured to electrically connect to the power network of the first PCB via the first and second electrically conductive pads on the second PCB.

2. The system of claim 1, wherein the power network is a power ground (PGND) network.

3. The system of claim 1, wherein the first leg is positioned halfway between a first end and a second end of the module.

4. The system of claim 3, wherein the heat sink has precisely two second legs, each of the second legs respectively disposed adjacent one of the first end or the second end.

5. The system of claim 4, wherein the module has precisely one inductor and one of the two second legs is adjacent and aligned with the one inductor.

6. The system of claim 4, wherein the module has precisely two inductors, the two inductors disposed on opposite ends of the first PCB.

7. The system of claim 6, wherein each of the two second legs is disposed adjacent and aligned with a respective one of the two inductors.

8. The system of claim 1, wherein the module has precisely four inductors and precisely four second legs.

9. The system of claim 8, wherein each of the four second legs is disposed adjacent and aligned with a respective one of the four inductors.

10. The system of claim 9, wherein distal ends of the four second legs are formed into a unitary base.

11. The system of claim 1, wherein the cap portion includes at least one slot formed therethrough that is adjacent and aligned with the at least one electrical component.

12. The system of claim 11, wherein the at least one slot is configured to reduce magnetic fringing.

13. The system of claim 12, wherein the at least one slot is a rectangular opening formed through the cap portion.

14. The system of claim 13, wherein the cap portion includes a planar rectangular shape.

15. The system of claim 14, wherein the cap portion is at least an area of the first PCB.

16. The system of claim 1, wherein the first leg is precisely one first leg.

17. A system, comprising:
   a main circuit board having first and second electrically conductive pads;
   a module, comprising:
      a printed circuit board surface mounted to the first and second electrically conductive pads on the main circuit board;
      at least one electrical component mounted to the printed circuit board; and
      a power network in electrical communication with the main circuit board via the first second electrically conductive pads; and
   a heat sink, comprising:
      a first leg surface mounted to the first electrically conductive pad on the main circuit board adjacent to the printed circuit board;
      at least one second leg opposite the first leg and surface mounted to the second electrically conductive pad on the main circuit board adjacent to the printed circuit board; and
      a cap portion connecting the first leg to the at least one second leg,
      wherein the heat sink is sized and shaped to at least partially encompass the module, and
      wherein the heat sink is electrically connected to the power network via the first and second electrically conductive pads.

18. The system of claim 17, wherein the module and the heat sink are surface mounted to a plurality of conductive pads of the main circuit board.

19. The system of claim 17, wherein the heat sink is configured to dissipate heat generated by the module through the connection to the power network.

20. A system, comprising:
- a first printed circuit board (PCB) having first and second electrically conductive pads;
- a module, comprising:
  - a second PCB electrically defining a power ground (PGND) network, wherein the second PCB has a first side and a second side opposing the first side, and wherein the second side is surface mounted to the first PCB via the first and second electrically conductive pads, and wherein the PGND network is electrically connected to the first and second electrically conductive pads; and
  - at least one electrical component mounted to the first side of the second PCB; and
- a heat sink, comprising:
  - a first leg surface mounted to the first electrically conductive pad on the first PCB adjacent to the second PCB;
  - at least one second leg opposite the first leg that is surface mounted to the second electrically conductive pad on the first PCB adjacent to the second PCB; and
  - a cap portion connecting the first leg to the at least one second leg,
  - wherein the heat sink is sized and shaped to at least partially encompass the module, and
  - wherein the heat sink electrically connects to the PGND network of the second PCB via the first and second electrically conductive pads on the first PCB.

* * * * *